ated by examiner

(12) United States Patent
Castaneda et al.

(10) Patent No.: US 8,086,263 B2
(45) Date of Patent: *Dec. 27, 2011

(54) DOUBLE TRANSFORMER BALUN FOR MAXIMUM POWER AMPLIFIER POWER

(75) Inventors: Jesus Alfonso Castaneda, Los Angeles, CA (US); Qiang Li, Irvine, CA (US); Ahmadreza (Reza) Rofougaran, Newport Coast, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/031,833

(22) Filed: Feb. 22, 2011

(65) Prior Publication Data

US 2011/0133835 A1 Jun. 9, 2011

Related U.S. Application Data

(63) Continuation of application No. 10/819,388, filed on Apr. 7, 2004, now Pat. No. 7,904,108.

(60) Provisional application No. 60/554,573, filed on Mar. 19, 2004.

(51) Int. Cl.
*H04M 1/00* (2006.01)
*H01F 27/28* (2006.01)

(52) U.S. Cl. .................. 455/550.1; 455/114.3

(58) Field of Classification Search ............... 455/550.1, 455/114.1, 121, 127.1, 234.2, 424; 336/145, 336/147; 340/646; 330/167; 315/177, 141, 142, 212, 213, 354; 343/856

See application file for complete search history.

(56) References Cited

U.S. PATENT DOCUMENTS

| 4,547,705 | A  | * | 10/1985 | Hirayama et al. ............. 315/219 |
| 5,262,932 | A  | * | 11/1993 | Stanley et al. .................. 363/26 |
| 7,904,108 | B2 | * | 3/2011  | Castandeda et al. ........ 455/550.1 |
| 2004/0022075 | A1 | * | 2/2004 | Perry .......................... 363/21.01 |
| 2004/0196129 | A1 | * | 10/2004 | Camwell et al. .............. 336/173 |

* cited by examiner

*Primary Examiner* — George Eng
*Assistant Examiner* — Scott Au
(74) *Attorney, Agent, or Firm* — Garlick Harrison & Markison; Shayne X. Short

(57) ABSTRACT

Double transformer balun for maximum PA (Power Amplifier) power. A novel approach is presented herein by which conversion from a differential signal to single-ended signal may be achieved using a double transformer balun design. The secondary coils of the double transformer balun also operate as a choke for the PA supply voltage. The secondary coils can operate as an RF (Radio Frequency) trap or choke to keep any AC (Alternating Current) signal components and to pass any DC (Direct Current) components. By using a double transformer balun design, relatively thinner tracks may be employed thereby ensuring a high degree of electromagnetic coupling efficiency and high performance. Also, these relatively thinner tracks consume a relatively small amount of space on the die. The double transformer balun design also includes a matching Z (impedance) block that is operable to match the Z of an antenna or line that the PA is driving.

20 Claims, 9 Drawing Sheets double transformer balun for maximum PA (Power Amplifier) power

WLAN (Wireless Local Area Network) communication system double transformer balun for maximum PA (Power Amplifier) power

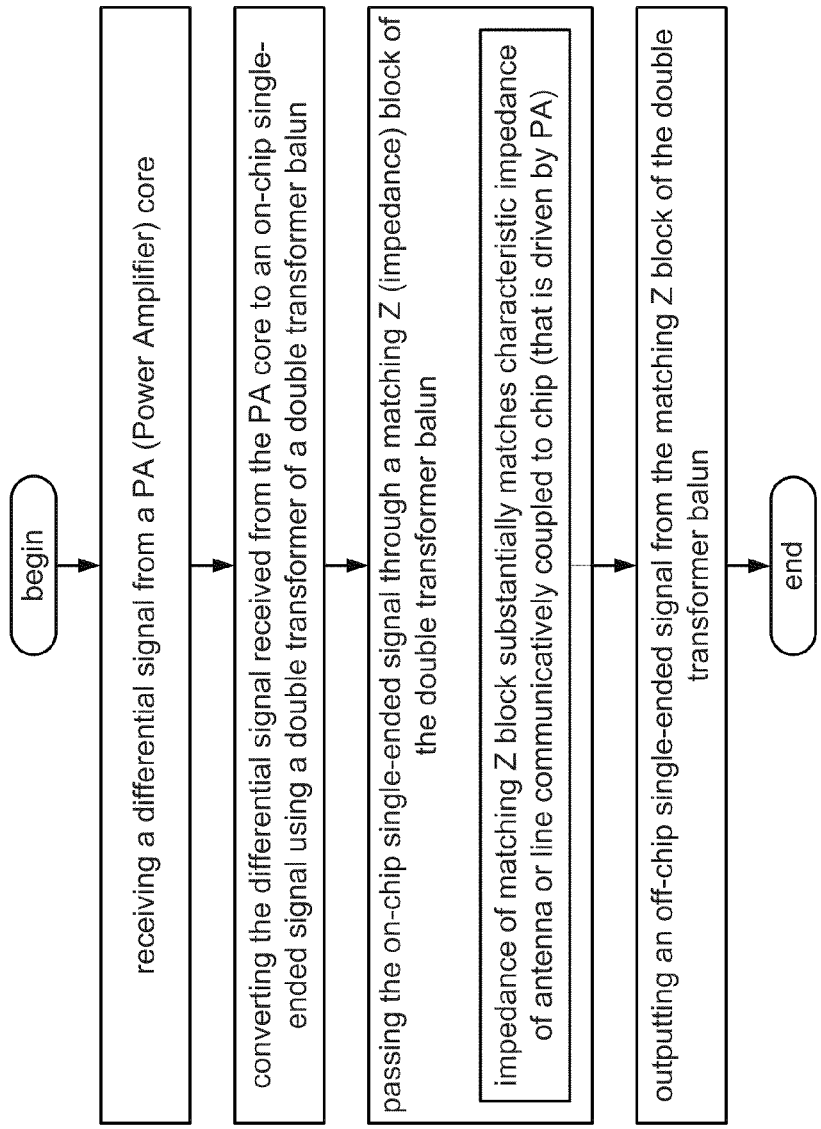

DOUBLE TRANSFORMER BALUN FOR MAXIMUM POWER AMPLIFIER POWER

CROSS REFERENCE TO RELATED PATENTS/PATENT APPLICATIONS

CONTINUATION PRIORITY CLAIM, 35 U.S.C. §120

The present U.S. Utility Patent Application claims priority pursuant to 35 U.S.C. §120, as a continuation, to the following U.S. Utility Patent Application which is hereby incorporated herein by reference in its entirety and made part of the present U.S. Utility Patent Application for all purposes:

1. U.S. Utility patent application Ser. No. 10/819,388, entitled "Double transformer balun for maximum power amplifier power,", filed Apr. 7, 2004, pending, and scheduled to be issued as U.S. Pat. No. 7,904,108 on Mar. 8, 2011 (as indicated in an ISSUE NOTIFICATION mailed on Feb. 16, 2011), which claims priority pursuant to 35 U.S.C. §119(e) to the following U.S. Provisional Patent Application which is hereby incorporated herein by reference in its entirety and made part of the present U.S. Utility patent application for all purposes:

a. U.S. Provisional Patent Application Ser. No. 60/554,573, entitled "Double transformer balun for maximum power amplifier power,", filed Mar. 19, 2004, now expired.

BACKGROUND OF THE INVENTION

1. Technical Field of the Invention

The invention relates generally to communication devices; and, more particularly, it relates to connectivity of the various components and circuits within such communication devices.

2. Description of Related Art

Data communication systems have been under continual development for many years. Within such communication systems, there are many communication devices included therein that that include various integrated circuits, chips, modules, and functional blocks. These communication devices may be transceivers, transmitters, receivers, or even other peripheral type devices. Within these communication devices, various chips (e.g., sometimes referred to as integrated circuits, packages, encapsulated chips, and so on) are typically mounted on a PCB (Printer Circuit Board) and are typically communicatively coupled via the PCB to other chips that are mounted thereon. The manner in these various chips communicatively couple to the PCB can introduce some serious deficiencies to the overall communication device's performance. Moreover, even within the actual chips within these communication devices, the manner in which the various circuitry portions therein are communicatively coupled to one another may also introduce serious deficiencies to the overall communication device's performance. In many instances, differential type signals are employed within such communication devices for performance considerations such as noise immunity. As such, there is oftentimes a need to perform transformations to and from differential signals and single-ended signals. That is to say, there is often a need to transform a signal from a differential signal type to a single-ended signal type and vice versa. To perform this conversion from a signal from a differential signal type to a single-ended signal type, the circuitry of the communication device will typically employ a balun (i.e., a balanced/unbalanced transformer). That is to say, within an integrated circuit, a communication approach by which this transformation (e.g., differential to single-ended) is performed is to use a balun within the circuitry of a chip. The balun is typically implemented as a transformer on the chip whose windings are actually implemented on the die of the chip.

Until very recently, these baluns were implemented as being off-chip, i.e., on the PCB (Printer Circuit Board), and they were typically implemented in the form of micro-strip lines. More recent attempts to integrate a balun onto a chip have met with some serious performance limitations. For example, parallel winding, inter-wound winding, overlay winding, single planar, square wave winding, and concentrical spiral winding on-chip baluns have been tried with limited success. Each of these on-chip baluns suffers from one or more of: low quality factor, (which causes the balun to have a relatively large noise figure); too low of a coupling coefficient (which results in the inductance value of the balun not significantly dominating the parasitic capacitance making impedance matching more complex); asymmetrical geometry (which results in degradation of differential signals); and a relatively high impedance ground connection at the operating frequency.

Moreover, in the wireless communication system context (e.g., RF (Radio Frequency) communication systems), these integrated circuits have met with limited success larger in part to the manner in which they are implemented. In addition, within higher power applications, the size of the balun on the die can itself introduce some significant problems. This is largely because the size of the tracks of the transformed balun to support these higher power applications is implemented using relatively wider tracks and this inherently requires a larger spatial area on the die.

FIG. 1A is a diagram illustrating a prior art embodiment of a single transformer balun (having relatively wide tracks) within an integrated circuit (shown using a side view). As shown in this embodiment, a chip (e.g., which may alternatively be referred to as an encapsulated chip, package, an integrated circuit, or other terminology) typically includes a die (e.g., a silicon substrate) on which a certain amount of circuitry is emplaced. This circuitry may be referred to as on substrate circuitry. One portion of the on substrate circuitry may be a single transformer balun that is implemented as a transformer as described above. To support higher power applications, such a single transformer balun may be implemented using wound tracks on the substrate. The windings (shown as a winding 1 and a winding 2) are separated by a dielectric insulating layer, and the magnetic coupling between the windings operates as a transformer.

FIG. 1B is a diagram illustrating the same prior art embodiment of a single transformer balun (having relatively wide tracks) within an integrated circuit (shown using a top view). This embodiment shows a side view of the very same components as within the previous diagram. As can be seen, a chip may have several (sometimes hundreds or even more) or pins around the periphery of the chip. Each of these pins on the chip may communicatively couple to a PCB pad or trace for subsequent coupling to another location either on this same PCB or to another location.

Again, for higher power applications, the windings of the balun transformer are typically implemented in the prior art using relatively wider tracks. This increase in size is largely because of the need to use higher currents, to support lower input impedances ($Z_{in}$), and so on. However, this inherently requires that a larger area on the die is dedicated to the balun (given the wider and thicker tracks employed). The efficiency of the balun also reduces when a very wide balun transformer arrangement is employed; this is largely because the actual winding of the balun transformer become further and further apart thereby reducing the communicatively coupling between the windings of the primary and secondary of the balun transformer. Tightly coupled relatively thinner tracks (as in a low power balun transformer) offer a high degree of operational efficiency, in that, a high degree of electromagnetic coupling may be achieved. The further apart the tracks are, then the lower the degree of electromagnetic coupling may be achieved. The use of these relatively wider tracks, as employed within higher power applications, inherently results in a component having windings that are relatively further apart and therefore have a lower degree of electromagnetic coupling between them.

In addition, this problem can be exacerbated when the integrated circuit operates within a communication device that operates within a wireless communication system.

Looking at one example of a WLAN (Wireless Local Area Network) communication system operating according to one of the IEEE (Institute of Electrical & Electronics Engineers) 802.11 standards or recommended practices whose RF (Radio Frequency) carrier frequency, f, is within the 2.4 GHz (Giga-Hertz) frequency range, these relatively large track windings employed within such a transformer balun can operate as an antenna with respect to the wireless communication existing therein. This can lead to a great degree of interference.

As can be seen, there are many serious deficiencies when using a prior art approach of wide track balun transformers within integrated circuits. A great deal of interference and reduction of performance of the communication device may be experienced when using these prior art approaches. Clearly, there is a need in the art for a more effective and efficient way of performing the conversion between differential and single-ended signals, particularly within the high power and wireless communication system contexts.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 9 is a flowchart illustrating an embodiment of a method for providing maximum output power from a PA (Power Amplifier) according to certain aspects of the invention.

DETAILED DESCRIPTION OF THE INVENTION

Figure 1A:
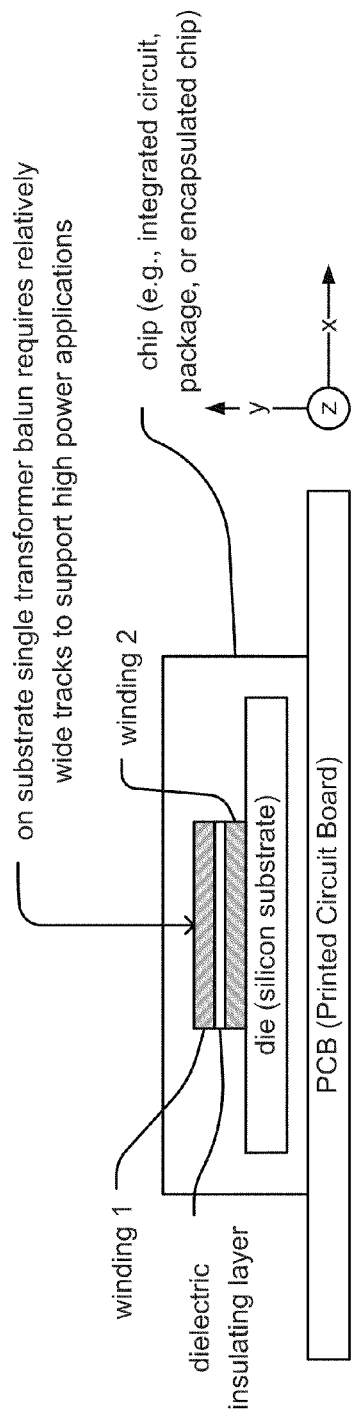
FIG. 1A is a diagram illustrating a prior art embodiment of a single transformer balun (having relatively wide tracks) within an integrated circuit (shown using a side view).
Figure 1B:
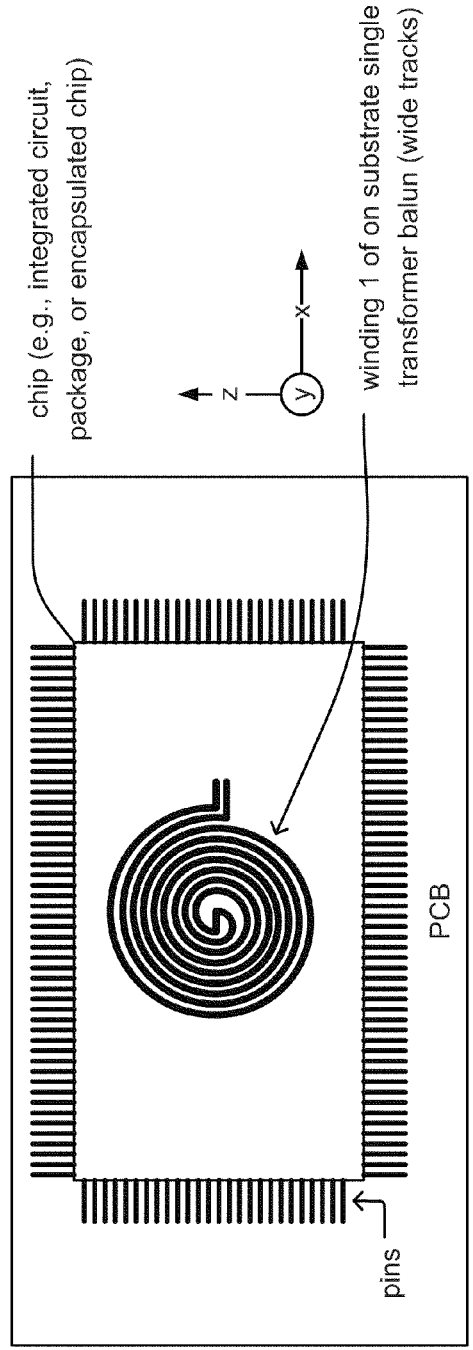
FIG. 1B is a diagram illustrating the same prior art embodiment of a single transformer balun (having relatively wide tracks) within an integrated circuit (shown using a top view).

Communication systems are known to support wireless and wire lined communications between wireless and/or wire lined communication devices. Such communication systems range from national and/or international cellular telephone systems to the Internet to point-to-point in-home wireless networks, among other communication system types. Each type of communication system is constructed, and hence operates, in accordance with one or more communication standards and/or protocols. For instance, wireless communication systems may operate in accordance with one or more standards including, but not limited to, IEEE (Institute of Electrical & Electronics Engineers) 802.11, Bluetooth® (e.g., the IEEE 802.15.1 Bluetooth® core), AMPS (Advanced Mobile Phone Services), digital AMPS, GSM (Global System for Mobile communications), CDMA (Code Division Multiple Access), LMDS (Local Multi-point Distribution Systems), MMDS (Multi-channel-Multi-point Distribution Systems), and/or variations thereof.

Depending on the type of wireless communication system, a wireless communication device, such as a cellular telephone, two-way radio, PDA (Personal Digital Assistant), PC (Personal Computer), laptop computer, home entertainment equipment, et cetera, communicates directly or indirectly with other wireless communication devices. For direct communications (also known as point-to-point communications), the participating wireless communication devices tune their receivers and transmitters to the same channel or channels (e.g., one of the plurality of RF (Radio Frequency) carriers of the wireless communication system) and communicate over that channel(s). For indirect wireless communications, each wireless communication device communicates directly with an associated BS (Base Station) (e.g., for cellular services) and/or an associated AP (Access Point) (e.g., for an in-home or in-building wireless network) via an assigned channel. To complete a communication connection between the wireless communication devices, the associated BSs (Base Stations) and/or associated APs communicate with each other directly, via a system controller, via the PSTN (Public Switch Telephone Network), via the Internet, and/or via some other WAN (Wide Area Network).

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). A transmitter of such a communication device includes a data modulation stage, one or more IF (Intermediate Frequency) stages, and a PA (Power Amplifier). The data modulation stage converts raw data into baseband signals in accordance with a particular wireless communication standard. The one or more IF stages mix the baseband signals with one or more local oscillations to produce RF signals. The PA amplifies the RF signals prior to transmission via an antenna.

A receiver of such a communication device is coupled to the antenna and includes a LNA (Low Noise Amplifier), one or more IF stages, a filtering stage, and a data recovery stage. The LNA receives inbound RF signals via the antenna and amplifies them. The one or more IF stages mix the amplified RF signals with one or more local oscillations to convert the amplified RF signal into baseband signals or IF signals. The filtering stage filters the baseband signals or the IF signals to attenuate unwanted out of band signals to produce filtered signals. The data recovery stage recovers raw data from the filtered signals in accordance with the particular wireless communication standard.

It is also noted that certain variations of such communication devices perform frequency conversion directly from carrier frequency (e.g. RF frequency in some instances) to baseband and vice versa. That is to say, direct conversion of such frequencies may be performed within a communication device that operates according to certain aspects of the invention without departing from the scope and spirit of the invention thereof.

Within these various types of communication systems, there is inherently a need to communicatively couple the various integrated circuits, modules, and functional blocks therein such that they may operate cooperatively to perform their individual respective operations in conjunction with the other parts of the communication device. Certain of these components operate within the high power context (e.g., the PA (Power Amplifier) referred to above in one such component). A novel approach is presented herein by which a double transformer balun may be implemented to support for a maximum PA power. The manner by which a differential signal, provided as an output from a PA core, is converted to a single-ended signal may be implemented such that impedance, Z, matching may be performed according to the antenna or line that the PA is driving. In addition, the secondary coils of the double transformer balun can operate as a trap or choke with respect to any RF signals within the on-chip signals that are amplified by the PA. These secondary coils operate to keep out any AC (Alternating Current) signal component, and to pass only the DC (Direct Current) signal component. This can ensure that the on-chip supply voltage signal that is provided to the PA, $VDD_{PA}$, is choked out from the signals on which the PA is actually operating.

This novel approach by which a double transformer balun may be implemented to support for a maximum PA power may be used within any of a variety of communication devices within a variety of communication systems. For example, the functionality of the invention may be found in a variety of communication devices including those that operate according to the various standards and recommended practices that are provided under the umbrella of the IEEE 802.11 working group and/or the Wi-Fi Alliance (e.g., including the IEEE 802.11a standard, the IEEE 802.11b standard, and the IEEE 802.11g standard). Moreover, the functionality of the invention may also be found in communication devices that operate according to the wireless Bluetooth® communication standard and other wireless standards including the various standards and recommended practices that are provided under the umbrella of the IEEE (Institute of Electrical & Electronics Engineers) 802.15 working group (e.g., including the IEEE 802.15.1 Bluetooth® core, the IEEE 802.15.2 recommended practice specification, the IEEE 802.15.3 high data rate PAN standard, and the IEEE 802.15.3 WPAN (Wireless Personal Area Network) High Rate Alternative PHY Task Group 3a (TG3a) which is sometimes referred to the IEEE 802.15.3a extended high data rate PAN standard).

In addition, the functionality of the invention may be implemented within a variety of types of communication devices including those operable within various wireline and/or wireless based communication systems. This functionality may also be implemented within a monolithic single chip design of an integrated circuit that may be employed within a wireless (e.g., IEEE 802.11b and/or Bluetooth®) transceiver or other type device that is part of a larger communication system. Moreover, this functionality may also be found within a mouse, keyboard, or other type peripheral type device that is part of a larger computer type system in a cable replacement implementation approach such that each of these peripheral type devices may be viewed as being a transceiver.

Figure 2:
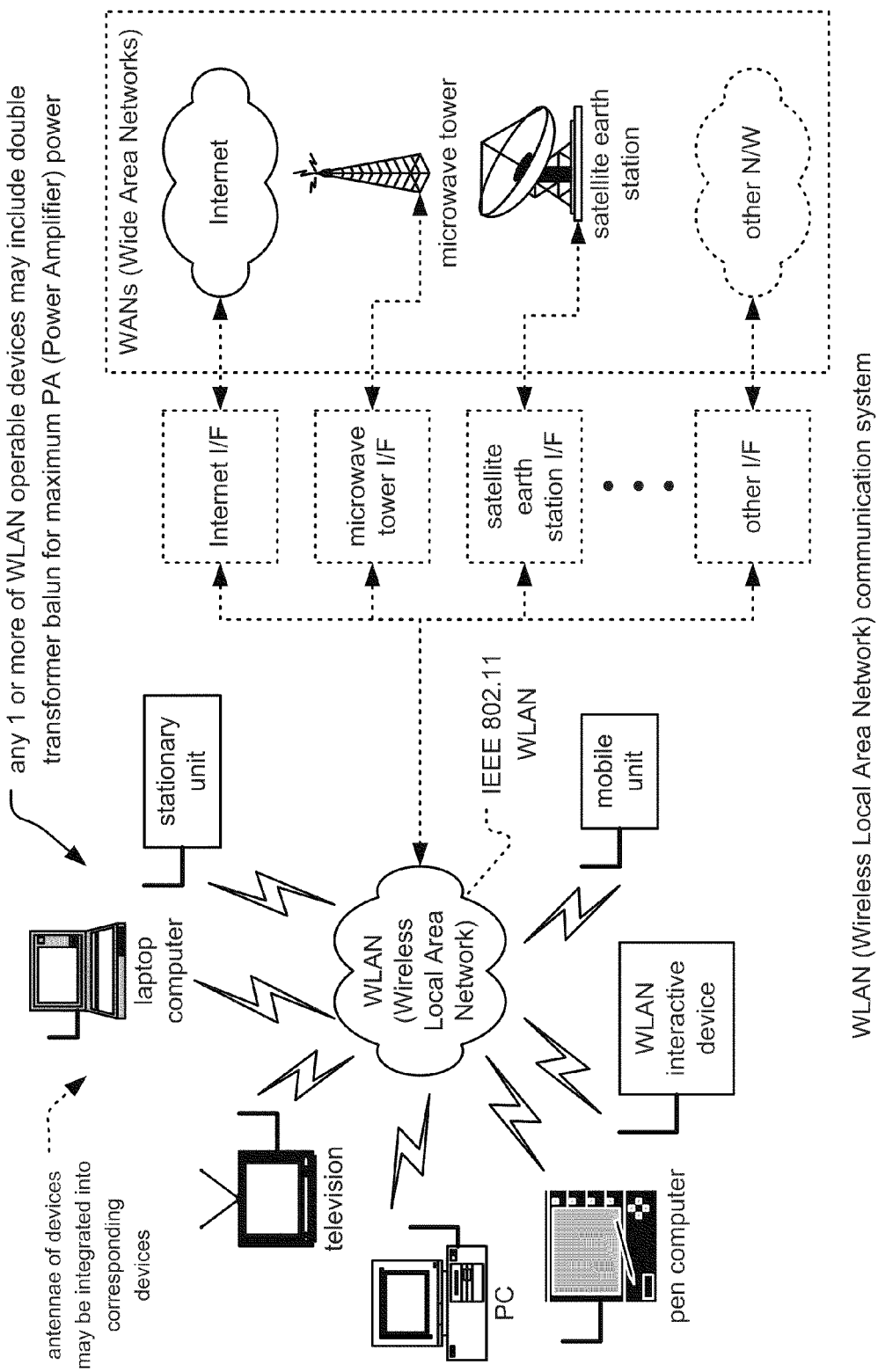
FIG. 2 is a diagram illustrating an embodiment of a WLAN (Wireless Local Area Network) communication system that may be implemented according to certain aspects of the invention.

FIG. 2 is a diagram illustrating an embodiment of a WLAN (Wireless Local Area Network) communication system that may be implemented according to the invention. The WLAN communication system may be implemented to include a number of devices that are all operable to communicate with one another via the WLAN. For example, the various devices that each include the functionality to interface with the WLAN may include any 1 or more of a laptop computer, a television, a PC (Personal Computer), a pen computer (that may be viewed as being a PDA (Personal Digital Assistant) in some instances, a personal electronic planner, or similar device), a mobile unit (that may be viewed as being a telephone, a pager, or some other mobile WLAN operable device), and/or a stationary unit (that may be viewed as a device that typically resides in a single location within the WLAN). The antennae of any of the various WLAN interactive devices may be integrated into the corresponding devices without departing from the scope and spirit of the invention as well.

This illustrated group of devices that may interact with the WLAN is not intended to be an exhaustive list of devices that may interact with a WLAN, and a generic device shown as a WLAN interactive device represents any communication device that includes the functionality in order to interactive with the WLAN itself and/or the other devices that are associated with the WLAN. Any one of these devices that associate with the WLAN may be viewed generically as being a WLAN interactive device without departing from the scope and spirit of the invention. Each of the devices and the WLAN interactive device may be viewed as being located at respective nodes of the WLAN.

It is also noted that the WLAN itself may also include functionality to allow interfacing with other networks as well. These external networks may generically be referred to as WANs (Wide Area Networks). For example, the WLAN may include an Internet I/F (interface) that allows for interfacing to the Internet itself. This Internet I/F may be viewed as being a base station device for the WLAN that allows any one of the WLAN interactive devices to access the Internet.

It is also noted that the WLAN may also include functionality to allow interfacing with other networks (e.g., other WANs) besides simply the Internet. For example, the WLAN may include a microwave tower I/F that allows for interfacing to a microwave tower thereby allowing communication with one or more microwave networks. Similar to the Internet I/F described above, the microwave tower I/F may be viewed as being a base station device for the WLAN that allows any one of the WLAN interactive devices to access the one or more microwave networks via the microwave tower.

Moreover, the WLAN may include a satellite earth station I/F that allows for interfacing to a satellite earth station thereby allowing communication with one or more satellite networks. The satellite earth station I/F may be viewed as being a base station device for the WLAN that allows any one of the WLAN interactive devices to access the one or more satellite networks via the satellite earth station I/F.

This finite listing of various network types that may interface to the WLAN is also not intended to be exhaustive. For example, any other network may communicatively couple to the WLAN via an appropriate I/F that includes the functionality for any one of the WLAN interactive devices to access the other network.

Any of the various WLAN interactive devices described within this embodiment may include an encoder and a decoder to allow bi-directional communication with the other WLAN interactive device and/or the WANs. The encoder of any of these various WLAN interactive devices may be implemented to encode information (using its corresponding encoder) in a manner in accordance with various communication standards and/or protocols of the WLAN communication system. Analogously, the decoder of any of the various WLAN interactive devices may be implemented to decode the transmitted signal (using its corresponding decoder) in a manner that also comports with the various communication standards and/or protocols of the WLAN communication system. This diagram shows just one of the many possible communication system embodiment types in which various communication devices may be implemented that can include any one or more of the various aspects of the invention. Within any one of these communication devices, a double transformer balun may be implemented to support for a maximum PA power for a PA that is implemented therein.

In some instances, any one of the WLAN interactive devices may be characterized as being an IEEE 802.11 operable device. For example, such an 802.11 operable device may be an 802.11a operable device, an 802.11b operable device, an 802.11g operable device, or an 802.11n operable device. Sometimes, an IEEE 802.11 operable device is operable to communicate according to more than one of the standards (e.g., both 802.11a and 802.11g in one instance). The IEEE 802.11g specification extends the rates for packet transmission in the 2.4 GHz (Giga-Hertz) frequency band. This is achieved by allowing packets, also known as frames, of two distinct types to coexist in this band. Frames utilizing DSSS/CCK (Direct Sequence Spread Spectrum with Complementary Code Keying) have been specified for transmission in the 2.4 GHz band at rates up to 11 Mbps (Mega-bits per second) as part of the 802.11b standard. The IEEE 802.11b standard may also operate in the 2.4 GHz spectrum using CSMA/CA (Carrier Sense Multiple Access with Collision Avoidance) as its media access approach. The 802.11a standard uses a different frame format with OFDM (Orthogonal Frequency Division Multiplexing) to transmit at rates up to 54 Mbps with carrier frequencies in the 5 GHz range. The 802.11g specification allows for such OFDM frames to coexist with DSSS/CCK frames at 2.4 GHz.

Regardless of which type of communication device and which type of communication system in which a communication device may be implemented, the novel approach by which an integrated circuit may include a double transformer balun to support maximum PA power may be used to provide for improved performance of that particular communication device and the overall communication system. Various other embodiments are also described below to show some of the various types of communication devices and/or communication systems in which certain aspects of the invention may be found.

Figure 3:
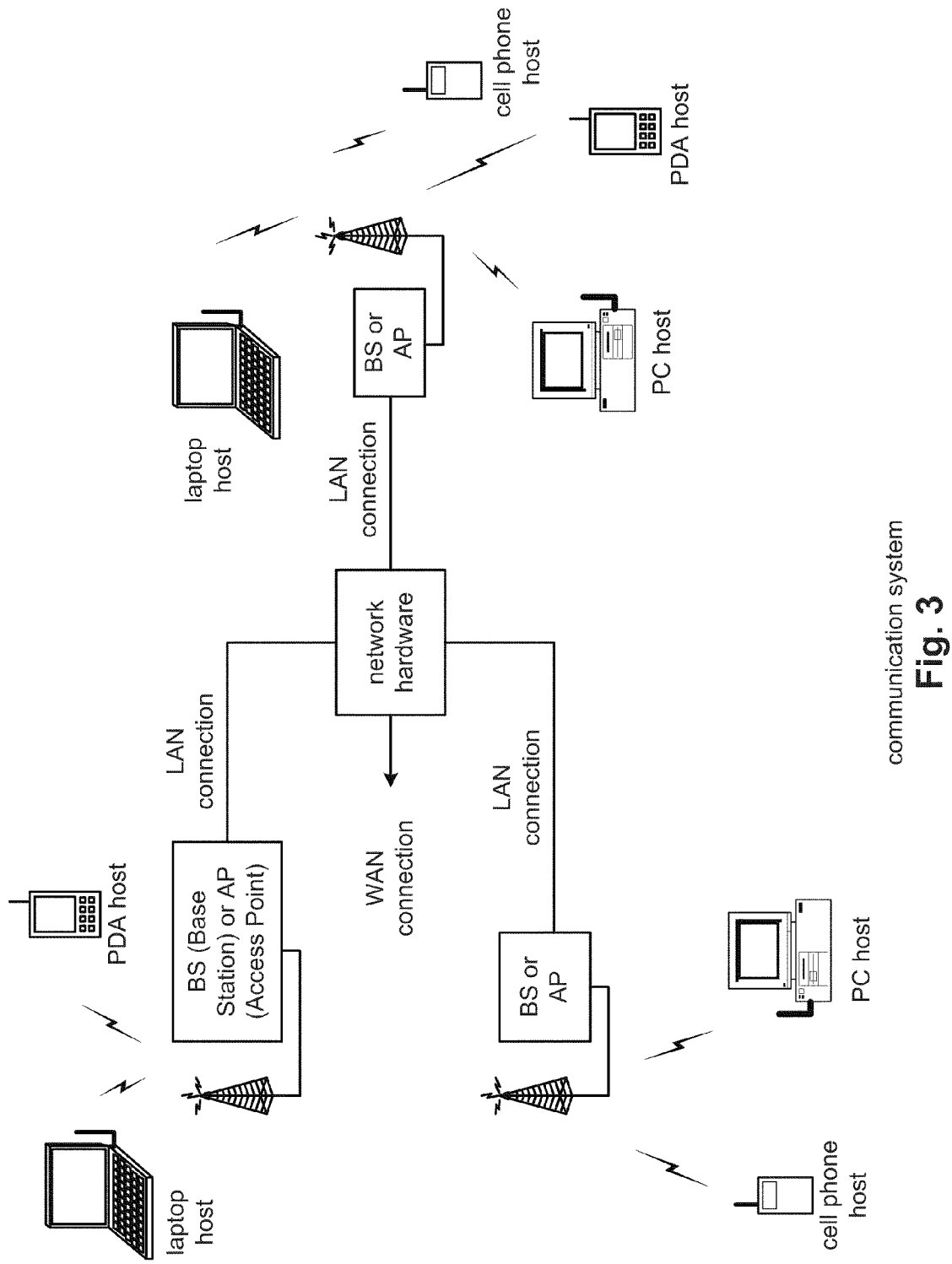
FIG. 3 is a schematic block diagram illustrating a communication system that includes a plurality of base stations and/or access points, a plurality of wireless communication devices and a network hardware component in accordance with certain aspects of the invention.

FIG. 3 is a schematic block diagram illustrating a communication system that includes a plurality of base stations and/or access points, a plurality of wireless communication devices and a network hardware component in accordance with certain aspects of the invention. The wireless communication devices may be laptop host computers, PDA (Personal Digital Assistant) hosts, PC (Personal Computer) hosts and/or cellular telephone hosts. The details of any one of these wireless communication devices is described in greater detail with reference to FIG. 4 below.

The BSs (Base Stations) or APs (Access Points) are operably coupled to the network hardware via the respective LAN (Local Area Network) connections. The network hardware, which may be a router, switch, bridge, modem, system controller, et cetera, provides a WAN (Wide Area Network) connection for the communication system. Each of the BSs or APs has an associated antenna or antenna array to communicate with the wireless communication devices in its area. Typically, the wireless communication devices register with a particular BS or AP to receive services from the communication system. For direct connections (i.e., point-to-point communications), wireless communication devices communicate directly via an allocated channel.

Typically, BSs are used for cellular telephone systems and like-type systems, while APs are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 4:
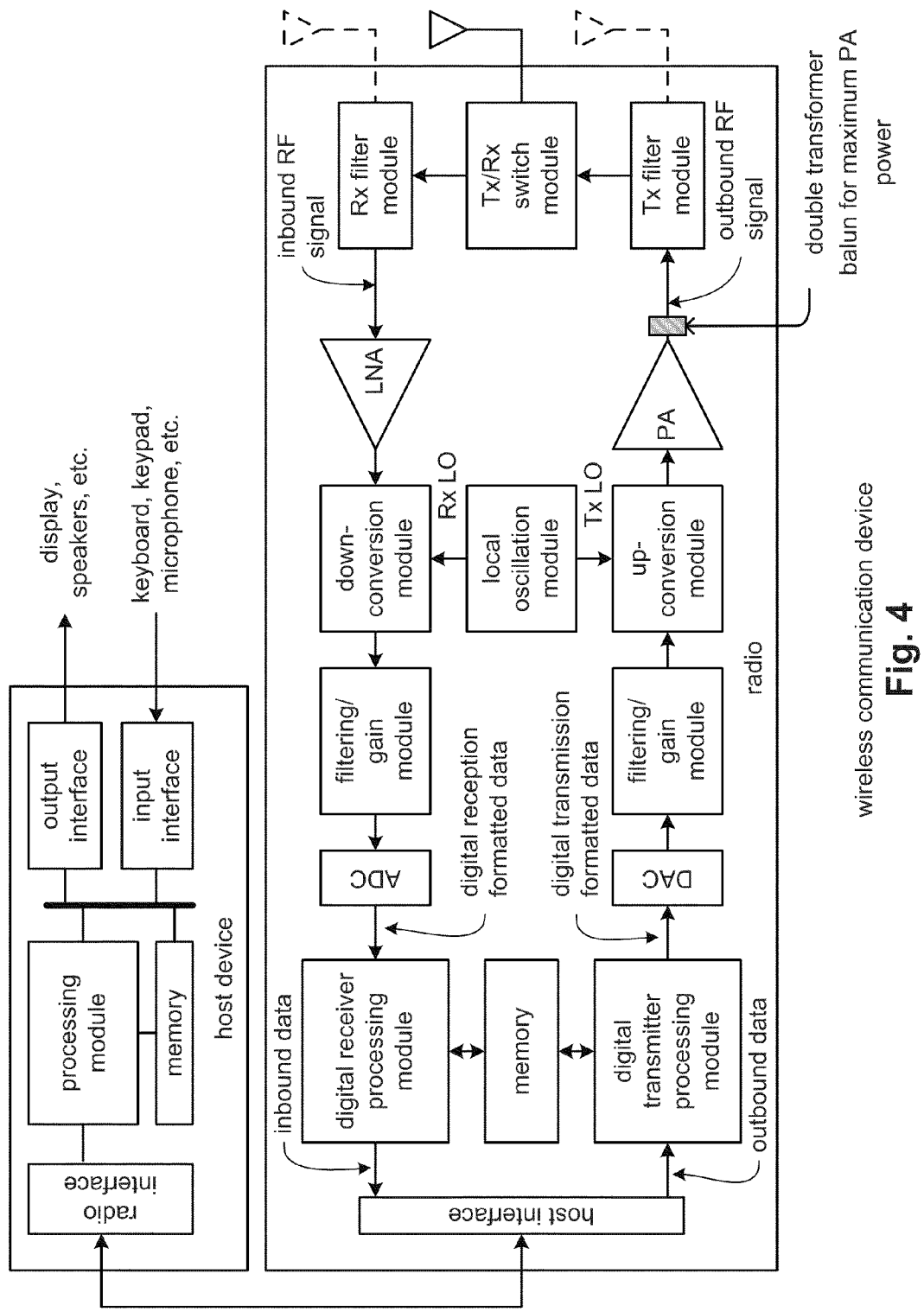
FIG. 4 is a schematic block diagram illustrating a wireless communication device that includes the host device and an associated radio in accordance with certain aspects of the invention.

FIG. 4 is a schematic block diagram illustrating a wireless communication device that includes the host device and an associated radio in accordance with certain aspects of the invention. For cellular telephone hosts, the radio is a built-in component. For PDA PDA (Personal Digital Assistant) hosts, laptop hosts, and/or personal computer hosts, the radio may be built-in or an externally coupled component.

As illustrated, the host device includes a processing module, memory, radio interface, input interface and output interface. The processing module and memory execute the corresponding instructions that are typically done by the host device. For example, for a cellular telephone host device, the processing module performs the corresponding communication functions in accordance with a particular cellular telephone standard or protocol.

The radio interface allows data to be received from and sent to the radio. For data received from the radio (e.g., inbound data), the radio interface provides the data to the processing module for further processing and/or routing to the output interface. The output interface provides connectivity to an output display device such as a display, monitor, speakers, et cetera, such that the received data may be displayed or appropriately used. The radio interface also provides data from the processing module to the radio. The processing module may receive the outbound data from an input device such as a keyboard, keypad, microphone, et cetera, via the input interface or generate the data itself. For data received via the input interface, the processing module may perform a corresponding host function on the data and/or route it to the radio via the radio interface.

The radio includes a host interface, a digital receiver processing module, an ADC (Analog to Digital Converter), a filtering/gain module, an IF (intermediate Frequency) mixing down conversion stage, a receiver filter, an LNA (Low Noise Amplifier), a transmitter/receiver switch, a local oscillation module, memory, a digital transmitter processing module, a DAC (Digital to Analog Converter), a filtering/gain module, an IF mixing up conversion stage, a PA (Power Amplifier), a transmitter filter module, and an antenna. The antenna may be a single antenna that is shared by the transmit and the receive paths as regulated by the Tx/Rx (Transmit/Receive) switch, or may include separate antennas for the transmit path and receive path. The antenna implementation will depend on the particular standard to which the wireless communication device is compliant.

The digital receiver processing module and the digital transmitter processing module, in combination with operational instructions stored in memory, execute digital receiver functions and digital transmitter functions, respectively. The digital receiver functions include, but are not limited to, digital IF (Intermediate Frequency) to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules may be implemented using a shared processing device, individual processing devices, or a plurality of processing devices. Such a processing device may be a microprocessor, micro-controller, DSP (Digital Signal Processor), microcomputer, CPU (Central Processing Unit), FPGA (Field Programmable Gate Array), programmable logic device, state machine, logic circuitry, analog circuitry, digital circuitry, and/or any device that manipulates signals (analog and/or digital) based on operational instructions. The memory may be a single memory device or a plurality of memory devices. Such a memory device may be a ROM (Read Only Memory), RAM (Random Access Memory), volatile memory, non-volatile memory, static memory, dynamic memory, flash memory, and/or any device that stores digital information. It is noted that when either of the digital receiver processing module or the digital transmitter processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio receives outbound data from the host device via the host interface. The host interface routes the outbound data to the digital transmitter processing module, which processes the outbound data in accordance with a particular wireless communication standard (e.g., IEEE 802.11, Bluetooth®, et cetera) to produce digital transmission formatted data. The digital transmission formatted data is a digital base-band signal or a digital low IF signal, where the low IF typically will be in the frequency range of one hundred kHz (kilo-Hertz) to a few MHz (Mega-Hertz).

The DAC converts the digital transmission formatted data from the digital domain to the analog domain. The filtering/gain module filters and/or adjusts the gain of the analog signal prior to providing it to the IF mixing stage. The IF mixing stage converts the analog baseband or low IF signal into an RF signal based on a transmitter local oscillation provided by local oscillation module. The PA amplifies the RF signal to produce outbound RF signal, which is filtered by the transmitter filter module. The antenna transmits the outbound RF signal to a targeted device such as a base station, an access point and/or another wireless communication device.

The radio also receives an inbound RF signal via the antenna, which was transmitted by a BS, an AP, or another wireless communication device. The antenna provides the inbound RF signal to the receiver filter module via the Tx/Rx switch, where the Rx filter bandpass filters the inbound RF signal. The Rx filter provides the filtered RF signal to the LNA, which amplifies the signal to produce an amplified inbound RF signal. The LNA provides the amplified inbound RF signal to the IF mixing module, which directly converts the amplified inbound RF signal into an inbound low IF signal or baseband signal based on a receiver local oscillation provided by local oscillation module. The down conversion module provides the inbound low IF signal or baseband signal to the filtering/gain module. The filtering/gain module filters and/or gains the inbound low IF signal or the inbound baseband signal to produce a filtered inbound signal.

The ADC converts the filtered inbound signal from the analog domain to the digital domain to produce digital reception formatted data. The digital receiver processing module decodes, descrambles, demaps, and/or demodulates the digital reception formatted data to recapture inbound data in accordance with the particular wireless communication standard being implemented by radio. The host interface provides the recaptured inbound data to the host device via the radio interface.

As one of average skill in the art will appreciate, the wireless communication device of FIG. 4 may be implemented using one or more integrated circuits. For example, the host device may be implemented on one integrated circuit, the digital receiver processing module, the digital transmitter processing module and memory may be implemented on a second integrated circuit, and the remaining components of the radio, less the antenna, may be implemented on a third integrated circuit. As an alternate example, the radio may be implemented on a single integrated circuit. As yet another example, the processing module of the host device and the digital receiver and transmitter processing modules may be a common processing device implemented on a single integrated circuit. Further, the memories of the host device and the radio may also be implemented on a single integrated circuit and/or on the same integrated circuit as the common processing modules of processing module of the host device and the digital receiver and transmitter processing module of the radio.

An integrated circuit within the wireless communication device of FIG. 4 that includes the PA may be implemented such that the interface between the PA and the Tx filter module and subsequently to the antenna that the PA is driving may be implemented using a double transformer balun that supports maximum PA power. That is to say, a conversion from a differential signal, output from the PA, to the antenna that the PA is driving may be implemented using a double transformer balun that is implemented to support a maximum PA power as presented and described herein.

Figure 5:
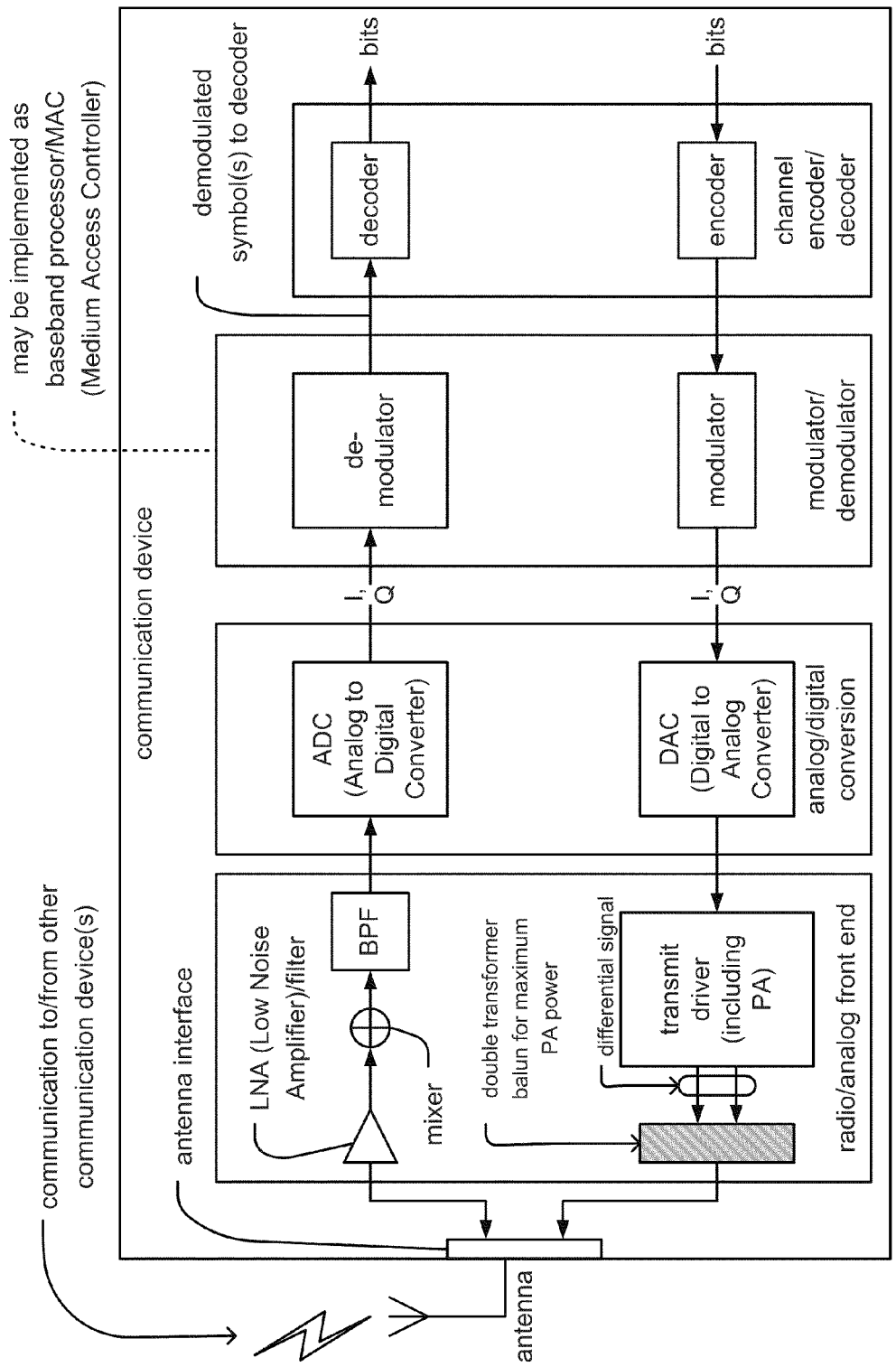
FIG. 5 is a diagram illustrating an embodiment of a communication device (shown in transceiver embodiment) that is built according to the invention.

FIG. 5 is a diagram illustrating an embodiment of a communication device that is built according to the invention. This embodiment shows a communication system that is capable of being implemented within a wireless type communication system; however, such a communication device could alternatively be implemented within a wireline type communication system as well without departing from the scope and spirit of the invention.

Being shown in a wireless context, this embodiment of a communication device includes an antenna that is operable to communicate with any 1 or more other communication devices within a given communication network. An antenna interface communicatively couples a signal to be transmitted from the communication device or a signal received by the communication device to the appropriate path (be it the transmit path or the receive path).

A radio/analog front end (that may also be referred to as "radio front end," "analog front end," "radio," and/or "front end") includes both receiver functionality and transmitter functionality. The radio front end communicatively couples to an analog/digital conversion functional block. The radio front end communicatively couples to a modulator/demodulator, and the radio front end communicatively couples to a channel encoder/decoder.

Along the Receive Path:

The receiver functionality of the radio/analog front end includes a LNA (Low Noise Amplifier)/filter. The LNA/filter is followed by a mixer that is operable to perform any modification in frequency of the received signal. Using the mixer, the receiver functionality of the front end performs any down-converting that may be required from a carrier frequency by which the received signal was transmitted. This may be performed by converting first down to an IF (Intermediate Frequency), or it may alternatively include down-converting directly from the received signal to a baseband signal (e.g. a direct conversion process). In addition, the mixer is followed by a BPF (Band Pass Filter) that is operable to tune the tuning frequency of the radio/analog front end to the appropriate frequency and therefore the appropriate channel.

Whichever particular manner is employed, a baseband signal is output from the receiver functionality of the radio/analog front end and is provided to an ADC (Analog to Digital Converter) that samples that signal and outputs the digital I, Q (In-phase, Quadrature) components of the baseband signal.

These I, Q components are provided to a demodulator portion of the modulator/demodulator where any modulation decoding/symbol mapping is performed such that the digitally sampled received symbol is mapped to an appropriate modulation (that includes a constellation and corresponding mapping). Examples of such modulations may include BPSK (Binary Phase Shift Key), QPSK (Quadrature Phase Shift Key), 8 PSK (8 Phase Shift Key), 16 QAM (16 Quadrature Amplitude Modulation), and even other modulation types including higher order modulation types. The appropriately mapped symbols are then provided to a decoder portion of the channel encoder/decoder where best estimates of the information bits contained within the received symbols are made.

Along the Transmit Path:

Somewhat analogous and opposite processing is performed in the transmit path when compared to the receive path. Information bits that are to be transmitted are encoded using an encoder of the channel encoder/decoder. These encoded bits are provided to a modulator of the modulator/demodulator where modulation encoding/symbol mapping may be performed according to the modulation of interest. These now I, Q components of the symbols are then passed to a DAC (Digital to Analog Converter) of the analog/digital conversion functional block. The now analog signal to be transmitted is then passed to a transmit driver that performs any necessary up-converting/modification to the analog signal to comport it to the communication channel over which the signal is to be transmitted to another communication device via the antenna. This transmit driver may be implemented using a PA as also described above with respect to other embodiments. The chip that includes the PA may be implemented and mounted on a PCB, and the interface between the PA and the antenna that the PA is driving may be implemented using a double transformer balun that supports maximum PA power. That is to say, a conversion from a differential signal, output from the PA, to the antenna that the PA is driving may be implemented using a double transformer balun that is implemented to support a maximum PA power as presented and described herein.

Figure 6:
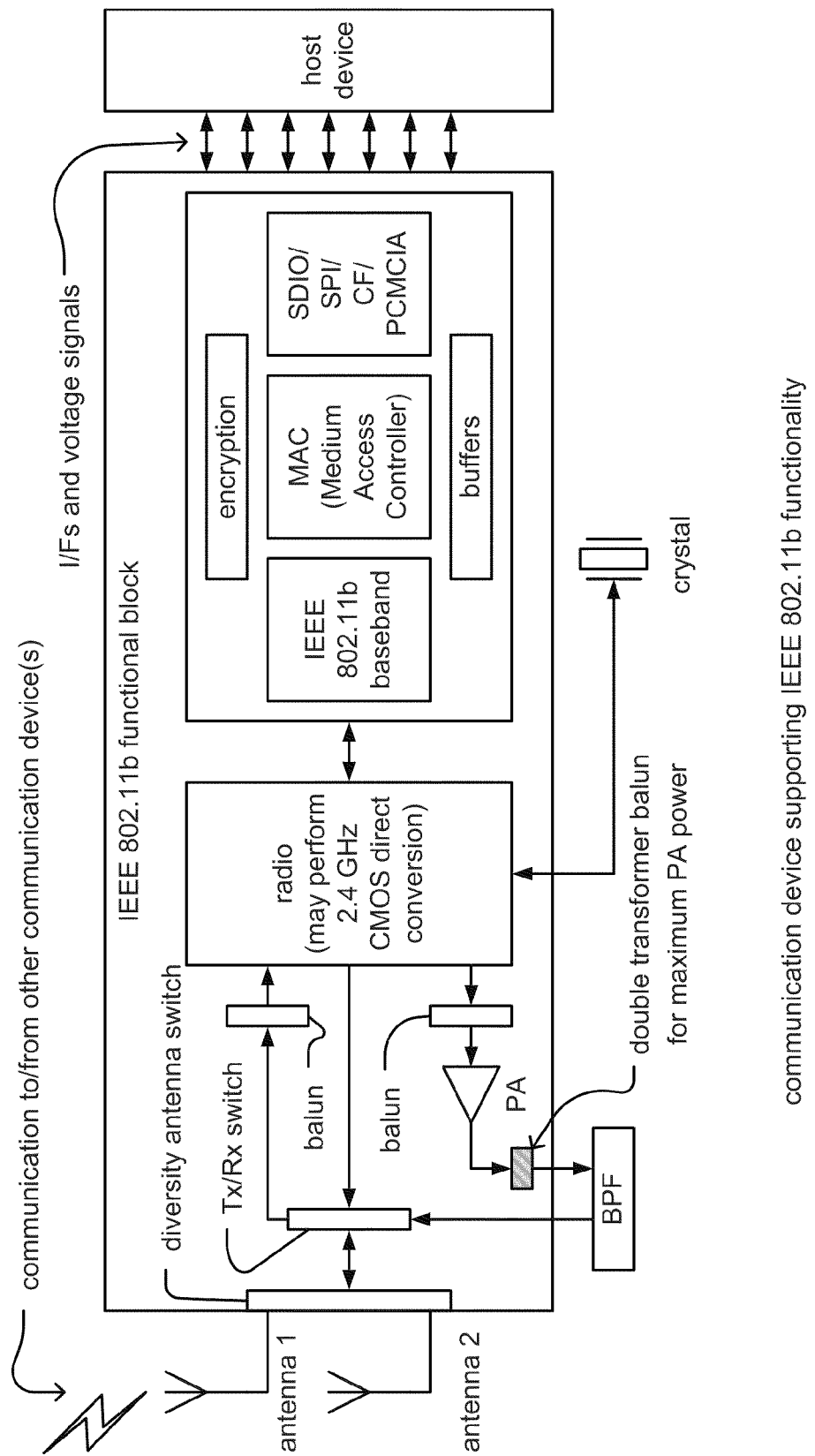
FIG. 6 is a diagram illustrating an embodiment of a communication device supporting IEEE (Institute of Electrical & Electronics Engineers) 802.11b functionality in accordance with certain aspects of the invention.

FIG. 6 is a diagram illustrating an embodiment of a communication device supporting IEEE (Institute of Electrical & Electronics Engineers) 802.11b functionality in accordance with certain aspects of the invention. This diagram shows how IEEE 802.11b WLAN functionality may be implemented on a small, single-sided module that can be optimized for handheld applications. The following diagram (FIG. 7) shows how an optional Bluetooth® populate option on a second side of the board for users who may want an extremely broad range of operations and communication systems types in which the communication device may operate and thereby providing an extremely versatile range in wireless connectivity.

Referring to the FIG. 6, an IEEE 802.11b functional block may be implemented as a monolithic, single chip. A dual antenna approach may be employed for diversity in dealing with undesirable deleterious effects such as multi-path effects. A diversity antenna switch may be used to select either one or both of the 2 antennae of the communication device. A Tx/Rx switch coupled to the diversity antenna switch determines whether to be transferred to the receive or transmit paths of the communication device. The receive path includes a balun whose output is then communicatively coupled to the radio. The transmit path, extending from the radio, communicatively couples to a balun, then to a PA (Power Amplifier) whose output is communicatively coupled off-chip to a BPF (Band Pass Filter) using a double transformer balun that is implemented to support a maximum PA power, and then back through the Tx/Rx switch.

As mentioned above, this IEEE 802.11b functional block can be employed as a single chip IEEE 802.11b implementation. An extremely efficient means of integration is performed to include a radio, an IEEE 802.11b baseband processor, a MAC (Medium Access Controller), a PA (Power Amplifier), and all other RF (Radio Frequency) components that would typically be found on a LAN (Local Area Network) circuit board. However, all of these components can now be provided within a single integrated circuit (e.g., a single chip). The radio may be implemented to perform direct conversion of a signal from a carrier frequency to a baseband signal. For example, the radio may be implemented to perform direct conversion of a 2.4 GHz signal to a baseband signal using components having an all CMOS (Complementary Metal Oxide Semiconductor) design. This all-CMOS implementation of the radio provides for a significant decrease in power consumption and a reduction in many, many components thereby providing for improved power management (e.g., power reduction) and also thereby providing for a more affordable communication device that can perform wireless connectivity. Such a communication device having this implementation can have an extended battery life due to the low power all-CMOS design and the comprehensive power management performed therein. The comprehensive power management approach can improve the battery life by creating a deep sleep state when the communication device is in a stand-by mode. Some of the high performance and interfacing features of this communication device include SDIO (Secure Digital Input/Output), SDIO with a Bluetooth® option, SPI (Serial Peripheral Interface), CF (Compact Flash), and PCMCIA (Personal Computer Miniature Communications Interface Adapter).

Figure 7:
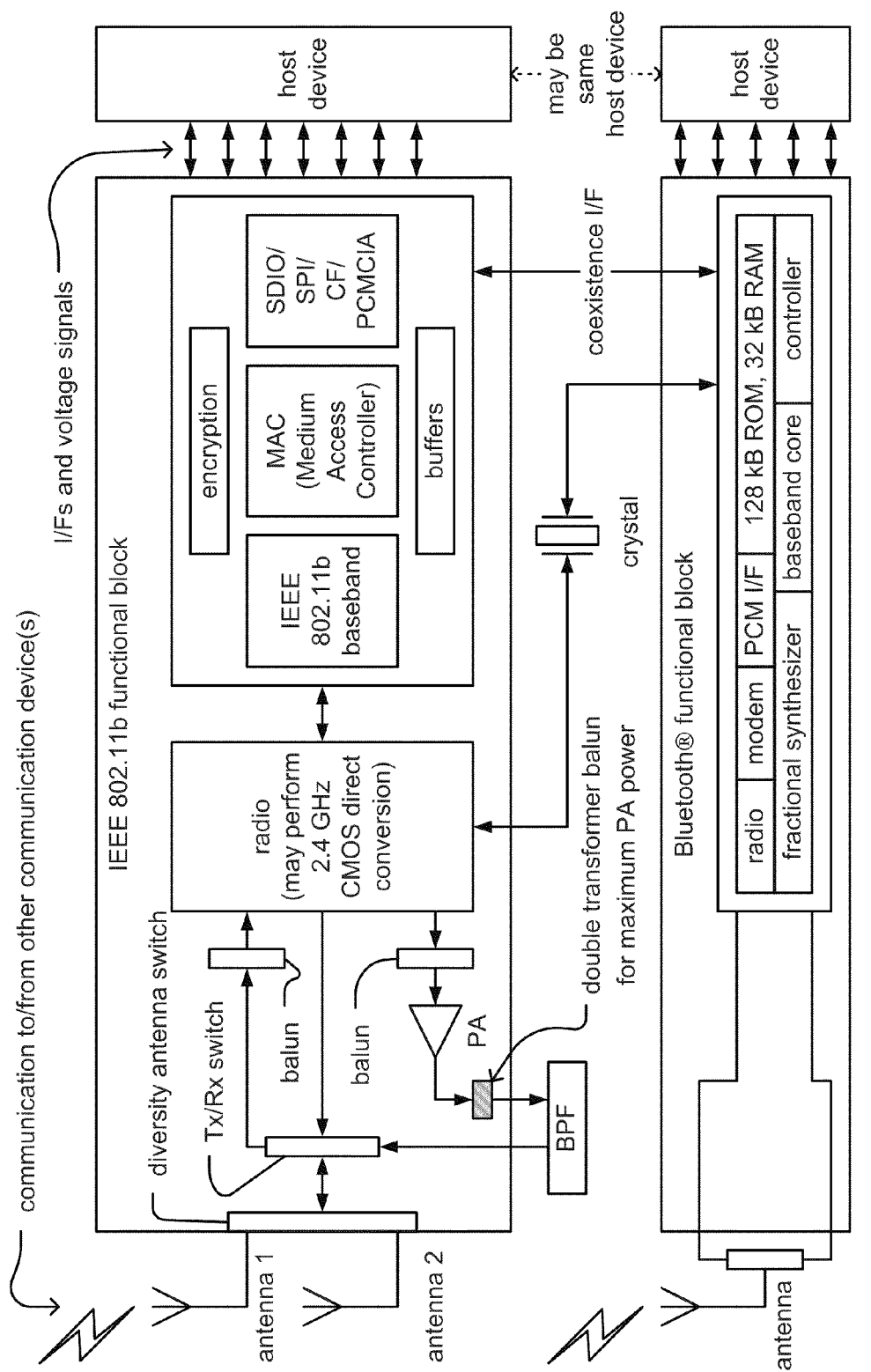
FIG. 7 is a diagram illustrating an embodiment of a communication device supporting both IEEE 802.11b functionality and Bluetooth® functionality in accordance with certain aspects of the invention.

FIG. 7 is a diagram illustrating an embodiment of a communication device supporting both IEEE 802.11b functionality and Bluetooth® functionality in accordance with certain aspects of the invention. This embodiment shows a coexistence I/F (interface) between an IEEE 802.11b functional block and a Bluetooth® functional block. Each of these two functional blocks may be individual chips. Together, these chipsets cooperatively can provide for IEEE 802.11b functionality and Bluetooth® functionality. This combination of these two separate functional blocks effectively addresses the size, power, cost, interface, manufacturing, and ease of deployment issues necessary for a solution targeted at the handheld wireless market.

This coexistence may be implemented in a very compact wireless device by mounting the IEEE 802.11b functional block as an integrated circuit on one side of a PCB, and the Bluetooth® functional block as another integrated circuit on the other side of the very same PCB. This coexistence interface between the WLAN (e.g., IEEE 802.11b) and the Bluetooth® chipsets ensures an optimal simultaneous performance of both of the wireless communication protocols.

Figure 8:
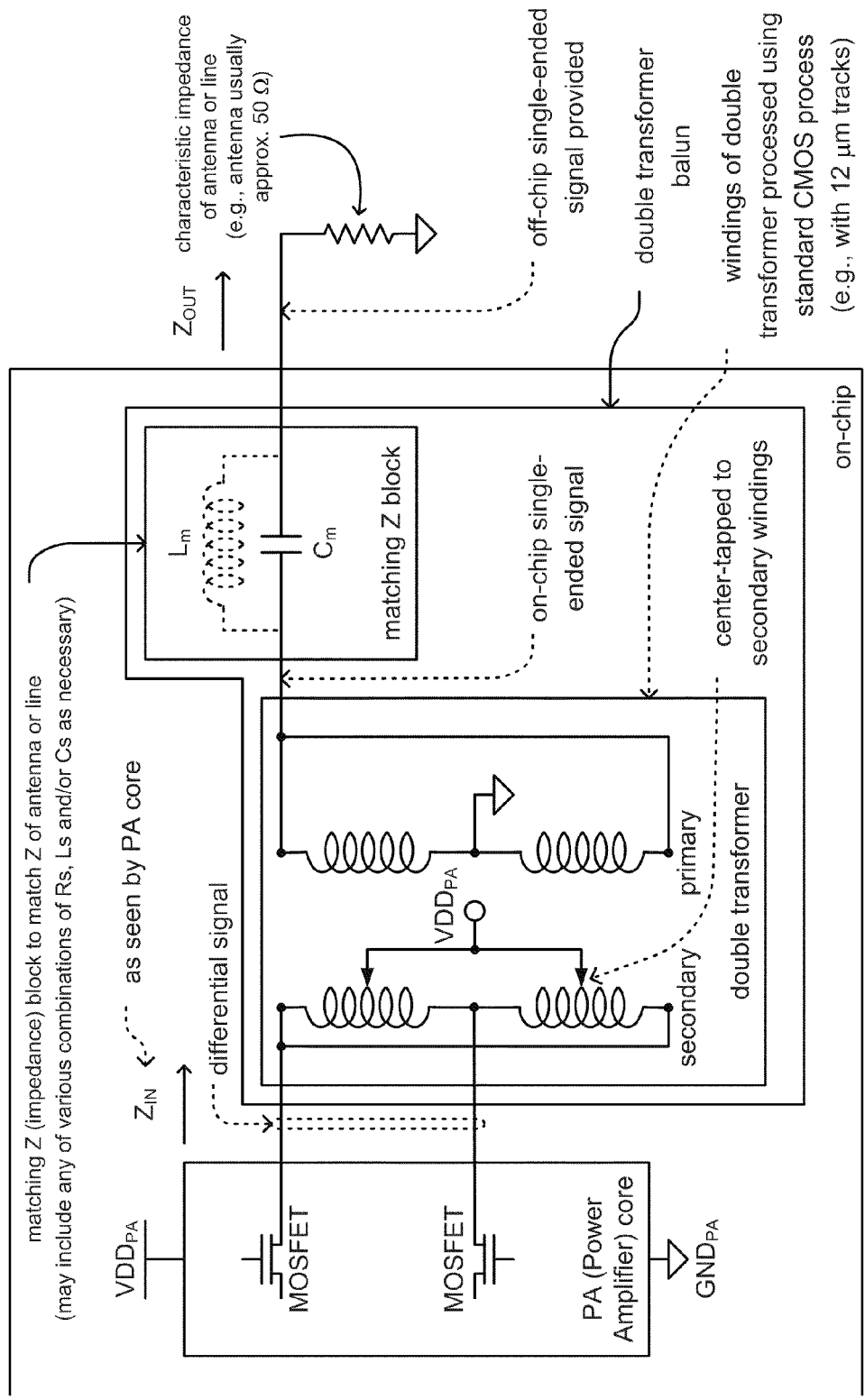
FIG. 8 is a diagram illustrating an embodiment of a double transformer balun that supports maximum PA (Power Amplifier) power in accordance with certain aspects of the invention.

FIG. 8 is a diagram illustrating an embodiment of a double transformer balun that supports maximum PA (Power Amplifier) power in accordance with certain aspects of the invention. This diagram shows, more specifically, the manner in which the interface between a PA core and an antenna or line that the PA is driving may be performed using a double transformer balun design that allows for maximum power to be derived from the PA. The PA core itself may be implemented using 2 MOSFET (Metal Oxide Semiconductor Field Effect Transistor) types devices that operate on differential types signals. The nodes corresponding to the supply potential level and ground potential levels within the chip (e.g., within the "package") and at the nodes of the PA core are shown as $VDD_{PA}$ and $GND_{PA}$, respectively. The output signal from the PA core is shown as being a differential signal. As mentioned above, the use of differential signals may be employed for a variety of improved performance considerations including noise immunity. The differential output signal, from the PA core, is provided to a double transformer balun that is implemented according to certain aspects the invention such that an off-chip single-ended signal may be provided to an antenna and/or line to which the chip is communicatively coupled. The antenna and/or line to which the chip is communicatively coupled is shown as having a characteristic impedance. The double transformer balun includes a functional block that operates to match this characteristic impedance of the antenna and/or line.

The double transformer balun includes a double transformer functional block that includes 2 separate transformers that are connected appropriately to provide for the function and benefits of certain aspects of the invention. The connections of the 2 separate transformers may be viewed as being a simple, parallel connection. One leg of the differential signal output from the PA core (e.g., output from one of the MOSFET components of the PA core) is provided simultaneously to both ends of the secondary winding of the double transformer balun (e.g., shown pictorially as the top and bottom of the secondary winding of the double transformer balun). The other leg of the differential signal output from the PA core (e.g., output from the other MOSFET component of the PA core) is provided to the node at which the windings of the secondary windings of each of the 2 transformers that compose the double transformer are communicatively coupled. That is to say, the secondary windings of each of the 2 transformers that compose the double transformer are communicatively coupled together: the output from one of the MOSFET devices of the PA core is provided to this node, and the other output from the other of the MOSFET devices of the PA core is provided to the other ends of each of the 2 transformers that compose the double transformer.

The primary windings of the double transformer are connected in such a way that the primary windings of each of the 2 transformers that compose the double transformer are communicatively coupled at a node; the ground potential level voltage is effectively coupled to this node. The other ends of each of the windings of the primary windings of each of the 2 transformers that compose the double transformer are also communicatively coupled to one another. Similarly, the windings of the secondary windings of each of the 2 transformers that compose the double transformer are communicatively coupled at a node; the $VDD_{PA}$ level signal is effectively coupled to this node. The other ends of each of the windings of the secondary windings of each of the 2 transformers that compose the double transformer are also communicatively coupled to one another. This may be viewed as a parallel connected double transformer arrangement.

An on-chip single-ended is thereby output from the double transformer functional block of the double transformer balun. This on-chip single-ended signal is provided to a matching Z (impedance) block that includes a matching capacitor, $C_m$, in some embodiments.

From certain perspectives, the matching Z block may be viewed as including a capacitor whose capacitive-reactance $$\left(Z_{C_m} = -j \cdot \left(\frac{1}{\omega C_m}\right) = -j \cdot \left(\frac{1}{2\pi f \cdot C_m}\right)\right)$$

substantially cancels the inductive-reactance, ($Z_{antenna} = j\omega L = j2\pi fL$), that is associated with the antenna (or line) at a predetermined operating frequency, f. For example, at the predetermined operating frequency, f, the value of $C_m$ is selected such that the values of $Z_{C_m}$, and $Z_{antenna}$ are substantially equal in magnitude and opposite in sign.

Moreover, the matching Z block may include the appropriate impedance to match the Z of the antenna or line to which the integrated circuit is communicatively coupled and that the PA is driving. This matching Z block may include any combination of Rs, Ls, and/or Cs (resistors, inductors, and/or capacitors) as necessary to provide a Z such that is matches the Z of the antenna or line to which the integrated circuit is communicatively coupled and that the PA is driving. In some embodiments, the RF (Radio Frequency) carrier frequency, f, at which the communication system including this integrated circuit generates a characteristic impedance of an antenna (e.g., as in a wireless communication system context) of approximately 50Ω (that is primarily inductive-reactance). In such instances, the characteristic impedance of the matching Z block is also designed to be approximately 50Ω (however, implemented primarily as capacitive-reactance, which is opposite in sign to the antenna's primarily inductive-reactance). In these instances, the characteristic impedance of the antenna is typically not totally resistive in nature, and the matching Z block ensures that an appropriate amount of inductor-related impedance and/or capacitor-related impedance (e.g., sometimes referred to as inductive-reactance and/or capacitive-reactance) is included to match substantially the characteristic impedance of the antenna.

It can be seen that the double transformer balun, as described herein, includes both the double transformer and the matching Z block. The double transformer balun approach presented herein is a significant departure from the prior art approaches to use a single transformer balun with relatively wider tracks in an effort to support high power applications on-chip. The double transformer balun approach presented herein provides for a component that is operable to support high power applications requiring higher currents. This approach also provides for relatively low input impedance, $Z_{in}$, as seen by the PA core when providing its differential signal.

By using the double transformer design of the double transformer balun approach presented herein, thinner tracks can be employed thereby ensuring a high degree of electromagnetic coupling between the primary and secondary windings of the double transformer. These windings may be implemented using a standard CMOS (Complementary Metal Oxide Semiconductor) process (e.g., using approximately 12 µm (micrometer) thickness tracks). That is to say, each of the primary windings and the secondary windings of each of the two separate transformers of the double transformer may be implemented using on the integrated circuit that includes the double transformer balun using tracks that are generated using a standard CMOS process that generated tracks having a width of approximately 12 µm.

This is in contrast to the prior art approach or using wider tracks (e.g., thicker metal) to fabricate the windings of a single transformer balun; this prior art approach to employing a single transformer balun is typically not a practical approach. For higher power applications, the width of the tracks of a single transformer balun needs to be so relatively wide (to support the higher currents) that the electromagnetic coupling of the transformer is significantly compromised. This also results in a significant reduction in the power efficiency of the single balun transformer. The double transformer approach of the double transformer balun described herein has greater performance and improved efficiency than the prior art approaches of using wider tracks with a single transformer balun.

It is also noted that the secondary coils of the double transformer balun also operate as a choke for the on-chip PA supply voltage, $VDD_{PA}$. The secondary coils can operate as an RF (Radio Frequency) trap or choke to keep any AC (Alternating Current) signal components and to pass any DC (Direct Current) components. Also, the primary coils can operate as RF chokes or traps as well with respect to the differential input signal that is received by the double transformer of the double transformer balun.

It is also noted that the double transformer balun may be implemented using the processing and techniques described according to a symmetrical on-chip balun as described in the following U.S. Utility Patent Application/U.S. patent:

1. U.S. Utility patent application Ser. No. 10/055,425, entitled "ON-CHIP TRANSFORMER BALUN,", filed Jan. 23, 2002, now issued as U.S. Pat. No. 6,801,114 on Oct. 5, 2004.

FIG. 9 is a flowchart illustrating an embodiment of a method for providing maximum output power from a PA (Power Amplifier) according to certain aspects of the invention. The method involves receiving a differential signal from a PA (Power Amplifier) core. The method then involves converting the differential signal received from the PA core to an on-chip single-ended signal using a double transformer of a double transformer balun. The method then involves passing the on-chip single-ended signal through a matching Z (impedance) block of the double transformer balun. The impedance of the matching Z block substantially matches characteristic impedance of antenna or line communicatively coupled to chip (that is driven by PA). The method then involves outputting an off-chip single-ended signal from the matching Z block of the double transformer balun.

It is also noted that various methods may be performed, in accordance with the invention, in a manner similar to the operation and functionality of the various system and/or apparatus embodiments described above. In addition, such methods may be viewed as being performed within any of the appropriate system and/or apparatus embodiments (communication systems, communication transmitters, communication receivers, communication transceivers, and/or functionality described therein) that are described above without departing from the scope and spirit of the invention.

Various aspects of the invention can be found in a double transformer balun that is implemented in an integrated circuit. The double transformer balun includes a double transformer and a matching impedance block. The double transformer s operably coupled to convert a differential signal to an on-chip single-ended signal. The double transformer includes two separate transformers communicatively coupled in a parallel manner. The matching impedance block is operably coupled to each of primary windings of the two separate transformers of the double transformer to provide impedance matching for an antenna and/or a line that is communicatively coupled to an output of the matching impedance block. The on-chip single-ended signal passes through the matching impedance block before being provided off-chip via the output of the matching impedance block.

In certain embodiments, the differential signal is received from a PA (Power Amplifier) core that is also implemented on the integrated circuit, and the differential signal is provided to each of secondary windings of the two separate transformers of the double transformer. The PA core may be implemented on the integrated circuit using a first MOSFET (Metal Oxide Semiconductor Field Effect Transistor) device and a second MOSFET device such that a first leg of the differential signal is selected from the first MOSFET device and a second leg of the differential signal is selected from the second MOSFET device. The matching impedance block may be implemented to include a capacitor having a capacitive-reactance that substantially cancels an inductive-reactance associated with at least one of the antenna and the line at a predetermined operating frequency. Alternatively, any appropriate combination of elements may be employed to ensure that a characteristic impedance of the matching impedance block substantially matches the characteristic impedance of the antenna and/or line that the PA is driving.

The secondary windings of the two separate transformers of the double transformer may be viewed as operating as RF (Radio Frequency) chokes that substantially block any AC (Alternating Current) signal component for the differential signal. Analogously, the primary windings of the two separate transformers of the double transformer may be viewed as operating as RF chokes that substantially block any AC signal component for the on-chip single-ended signal.

The two separate transformers of the double transformer are communicatively coupled in a parallel manner such that the primary windings of the two separate transformers are connected at a first node and at a second node, respectively. The on-chip single-ended signal is provided from the first node to the matching impedance block, and the second node is communicatively coupled to an on-chip PA supply voltage. In addition, the two separate transformers of the double transformer are communicatively coupled in a parallel manner such that each end of secondary windings of the two separate transformers are connected at a third node and at a fourth node, respectively, and the second node is communicatively coupled to an on-chip PA supply voltage and also is center-tapped to each end of the secondary windings of the two separate transformers.

The primary windings and secondary windings of each of the two separate transformers of the double transformer may be implemented on the integrated circuit using tracks generated by a CMOS (Complementary Metal Oxide Semiconductor) process of approximately 12 μm (micro-meter) thickness. The integrated circuit may be implemented within a wide variety of communication devices includes a communication device that supports wireless communication according to at least one of an IEEE (Institute of Electrical & Electronics Engineers) 802.11b standard and an IEEE 802.15.1 Bluetooth® core.

The invention envisions any type of communication device that supports the functionality and/or processing described herein. Moreover, various types of methods may be performed to support the functionality described herein without departing from the scope and spirit of the invention as well.

In view of the above detailed description of the invention and associated drawings, other modifications and variations will now become apparent. It should also be apparent that such other modifications and variations may be effected without departing from the spirit and scope of the invention.

What is claimed is:

1. An apparatus, comprising:
a double transformer including a first transformer, having a first primary winding and a first secondary winding, and a second transformer, having a second primary winding and a second secondary winding, wherein:
   a first end of the first secondary winding and a first end of the second secondary winding connected for receiving a first leg of a differential signal;
   a second end of the first secondary winding and a second end of the second secondary winding connected for receiving a second leg of the differential signal;
   a first end of the first primary winding and a first end of the second primary winding connected for outputting a single-ended signal; and
   a second end of the first primary winding and a second end of the second primary winding grounded.

2. The apparatus of claim 1, wherein:
a first center tap of the first secondary winding and a second center tap of the second secondary winding connected to a power supply.

3. The apparatus of claim 1, wherein:
the single-ended signal being generated within the double transformer based on the differential signal.

4. The apparatus of claim 1, further comprising:
an impedance having an input for receiving the single-ended signal from the double transformer and having an output for providing an off-chip single-ended signal to at least one of an antenna and a line; and wherein:
the impedance effectuating impedance matching with the at least one of an antenna and a line.

5. The apparatus of claim 4, wherein:
the impedance including a capacitor having a capacitive-reactance for substantially canceling an inductive-reactance associated with at least one of the antenna and the line at a predetermined operating frequency.

6. The apparatus of claim 1, wherein:
the double transformer implemented within an integrated circuit.

7. The apparatus of claim 1, further comprising:
a power amplifier (PA) core for providing the differential signal to the double transformer;
an impedance having an input for receiving the single-ended signal from the double transformer and having an output for providing an off-chip single-ended signal to at least one of an antenna and a line; and wherein:
the impedance effectuating impedance matching with the at least one of an antenna and a line;

the PA, the double transformer, and the impedance implemented within an integrated circuit.

8. The apparatus of claim 1, wherein:
windings of each of the first transformer and the second transformer of the double transformer implemented on an integrated circuit using tracks generated by a CMOS (Complementary Metal Oxide Semiconductor) process of approximately 12 μm (micro-meter) thickness.

9. The apparatus of claim 1, wherein:
each of the first secondary winding and the second secondary winding operative as an RF (Radio Frequency) choke for substantially blocking any AC (Alternating Current) signal component for the differential signal.

10. The apparatus of claim 1, wherein:
each of the first primary winding and the second primary winding operative as an RF (Radio Frequency) choke for substantially blocking any AC (Alternating Current) signal component for the on-chip single-ended signal.

11. The apparatus of claim 1, wherein:
the apparatus being a communication device operative in accordance with at least one wireless communication standard or protocol.

12. An apparatus, comprising:
a power amplifier (PA) core for providing a differential signal;
a double transformer including a first transformer, having a first primary winding and a first secondary winding, and a second transformer, having a second primary winding and a second secondary winding, wherein:
   a first end of the first secondary winding and a first end of the second secondary winding connected for receiving a first leg of the differential signal;
   a second end of the first secondary winding and a second end of the second secondary winding connected for receiving a second leg of the differential signal;
   a first end of the first primary winding and a first end of the second primary winding connected for outputting a single-ended signal;
   a second end of the first primary winding and a second end of the second primary winding grounded; and
   a first center tap of the first secondary winding and a second center tap of the second secondary winding connected to a power supply; and
an impedance having an input for receiving the single-ended signal from the double transformer and having an output for providing an off-chip single-ended signal to at least one of an antenna and a line.

13. The apparatus of claim 12, wherein:
the impedance effectuating impedance matching with the at least one of an antenna and a line; and
the impedance including a capacitor having a capacitive-reactance for substantially canceling an inductive-reactance associated with at least one of the antenna and the line at a predetermined operating frequency.

14. The apparatus of claim 12, wherein:
the PA, the double transformer, and the impedance implemented within an integrated circuit.

15. The apparatus of claim 12, wherein:
windings of each of the first transformer and the second transformer of the double transformer implemented on an integrated circuit using tracks generated by a CMOS (Complementary Metal Oxide Semiconductor) process of approximately 12 μm (micro-meter) thickness.

16. The apparatus of claim 12, wherein:
the apparatus being a communication device operative in accordance with at least one wireless communication standard or protocol.

17. A method for operating a communication device, the method comprising:
  employing a double transformer for receiving a differential signal, wherein the double transformer including a first transformer, having a first primary winding and a first secondary winding, and a second transformer, having a second primary winding and a second secondary winding, including:
    at a first end of the first secondary winding connected to a first end of the second secondary winding, receiving a first leg of the differential signal;
    at a second end of the first secondary winding connected to a second end of the second secondary winding, receiving a second leg of the differential signal;
  from a first end of the first primary winding connected to a first end of the second primary winding, outputting a single-ended signal as a second end of the first primary winding and a second end of the second primary winding grounded.

18. The method of claim 17, further comprising:
  receiving the differential signal from a power amplifier (PA) core;
  employing an impedance having an input for receiving the single-ended signal from the double transformer and having an output for providing an off-chip single-ended signal to at least one of an antenna and a line; and
  wherein:
  the impedance effectuating impedance matching with the at least one of an antenna and a line;
  the PA, the double transformer, and the impedance implemented within an integrated circuit of the communication device.

19. The method of claim 17, wherein:
  windings of each of the first transformer and the second transformer of the double transformer implemented on an integrated circuit using tracks generated by a CMOS (Complementary Metal Oxide Semiconductor) process of approximately 12 µm (micro-meter) thickness.

20. The method of claim 17, wherein:
  the communication device operative in accordance with at least one wireless communication standard or protocol.

* * * * *